(12) United States Patent
Lamesch

(10) Patent No.: US 10,928,431 B2
(45) Date of Patent: Feb. 23, 2021

(54) CAPACITIVE MEASUREMENT CIRCUIT WITH OFFSET COMPENSATION

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 71 days.

(21) Appl. No.: 16/311,539

(22) PCT Filed: Jun. 27, 2017

(86) PCT No.: PCT/EP2017/065920
§ 371 (c)(1),
(2) Date: Dec. 19, 2018

(87) PCT Pub. No.: WO2018/002095
PCT Pub. Date: Jan. 4, 2018

(65) Prior Publication Data
US 2019/0234999 A1     Aug. 1, 2019

(30) Foreign Application Priority Data
Jun. 27, 2016   (LU) .......................................... 93 124

(51) Int. Cl.
*G01R 27/26*     (2006.01)
*H03K 17/955*    (2006.01)
(Continued)

(52) U.S. Cl.
CPC ....... *G01R 27/2605* (2013.01); *H03K 17/955* (2013.01); *H03K 17/962* (2013.01); *H03M 1/12* (2013.01); *H03K 2217/960725* (2013.01)

(58) Field of Classification Search
CPC ............. G01R 27/2605; H03K 17/955; H03K 17/962; H03K 2217/960725; H03M 1/12
(Continued)

(56) References Cited

U.S. PATENT DOCUMENTS

| | | | |
|---|---|---|---|
| 8,319,505 B1 | 11/2012 | Maharyta | |
| 2004/0059903 A1* | 3/2004 | Smith | G06F 1/3203 713/1 |

(Continued)

FOREIGN PATENT DOCUMENTS

| | | |
|---|---|---|
| DE | 202005020140 U1 | 5/2007 |
| DE | 102006029120 A1 | 12/2007 |
| WO | WO2009089872 A1 | 7/2009 |

OTHER PUBLICATIONS

International Search Report for International application No. PCT/EP2017/065920, dated Sep. 26, 2017, 3 pages.
(Continued)

*Primary Examiner* — Christopher P McAndrew
(74) *Attorney, Agent, or Firm* — Reising Ethington P.C.

(57) ABSTRACT

A measurement circuit for a capacitive measurement system includes a DC voltage source, a first switching member, a charge transfer circuit, an integration capacitor and a current sink electrically connected in parallel to the integration capacitor. The charge transfer circuit has an active semiconductor device and a direct current bias voltage source. At least one electrically conductive electrode that forms a capacitor of unknown capacitance in conjunction with a reference electrode is electrically connectable either to the DC voltage source for charging or to the charge transfer circuit for discharging into the integration capacitor. The charge transfer circuit is configured for receiving an electric input current at an input port and for giving out an electric output current at an output port that is equal to the electric (Continued)

input current within a predetermined range of voltages across the input port and the output port of the charge transfer circuit.

11 Claims, 3 Drawing Sheets

(51) Int. Cl.
    *H03K 17/96*     (2006.01)
    *H03M 1/12*     (2006.01)

(58) Field of Classification Search
    USPC ........................................................ 324/658
    See application file for complete search history.

(56) References Cited

U.S. PATENT DOCUMENTS

| | | |
|---|---|---|
| 2007/0146120 A1 | 6/2007 | Kachouh |
| 2008/0012581 A1 | 1/2008 | Schulz et al. |
| 2009/0072662 A1* | 3/2009 | Sadler .................. G06F 1/3203 310/319 |
| 2011/0054818 A1 | 3/2011 | Cantie et al. |
| 2011/0187308 A1* | 8/2011 | Suhama .................. H02P 27/06 318/798 |
| 2012/0043971 A1* | 2/2012 | Maharyta .................. G01D 5/24 324/658 |
| 2012/0043973 A1* | 2/2012 | Kremin .................. G06F 3/0416 324/658 |
| 2013/0141947 A1* | 6/2013 | Sakurai ............. H02M 3/33523 363/21.16 |
| 2013/0214825 A1* | 8/2013 | Wasekura ............... H02M 1/08 327/109 |
| 2013/0271187 A1* | 10/2013 | Hayashi ................. H03K 17/16 327/109 |
| 2015/0015229 A1* | 1/2015 | Teh ....................... H02M 3/157 323/284 |
| 2015/0084510 A1* | 3/2015 | Miura ................... H02M 3/335 315/119 |
| 2015/0316680 A1 | 11/2015 | Sieg |

OTHER PUBLICATIONS

Written Opinion for International application No. PCT/EP2017/065920, dated Sep. 26, 2017, 7 pages.

* cited by examiner

CAPACITIVE MEASUREMENT CIRCUIT WITH OFFSET COMPENSATION

TECHNICAL FIELD

The present invention generally relates to a measurement circuit for a capacitive measurement system, a capacitive measurement system comprising such measurement circuit and a method of operating such capacitive measurement system.

BACKGROUND OF THE INVENTION

Capacitive sensors and capacitive measurement systems employing capacitive sensors have a wide range of applications, and are among others used for the detection of the presence and/or the position of a conductive body in the vicinity of an electrically conductive electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one electrically conductive electrode at which the influence of an object or living being on the electric field of a capacitor formed by the at least one electrically conductive electrode and a reference location or object having reference potential is detected.

An exemplary application of a capacitive measurement system are vehicle seat occupancy detection and/or classification systems that are known to be employed as a means of assessing a potential activation of an installed vehicle passenger restraint system, such as an airbag. An output signal of the seat occupancy detection and/or classification system is usually transferred to an electronic control unit of the vehicle to serve, for instance, as a basis for a decision to deploy an air bag system to the vehicle seat.

Another application of capacitive sensors is an automatic actuation of motorized tailgates of motor vehicles, as is described for instance in utility patent document DE 20 2005 020 140 U1.

A satisfying performance of a capacitive measurement system essentially depends on its capability to operate satisfactorily at all potential ambient and/or sensor surrounding conditions, including instance air humidity, wetness, rainfall, snowfall, and dirty street conditions. Under these conditions, the capacitance of an electrically conductive electrode of a capacitive sensor changes, and the effect on capacitance of the capacitive sensor that is intended to be exploited in a specific application is masked by a capacitance offset.

From a signal measurement technique point of view this means a challenge, as a required precision of measurement has to be maintained over a complete range of values that the capacitance offset might take on.

As one way to meet this requirement it is known to charge the capacitor formed by the electrically conductive electrode with a reference voltage, and to then transfer the collected electric charge to a sampling capacitor whose capacitance is typically from 1000 to 100 000 times greater than that of the capacitor formed by the electrically conductive electrode. The process is repeated until the voltage at the sampling capacitor reaches a threshold. The number of transfer cycles required to reach the threshold is representative of the capacitance of the capacitor formed by the electrically conductive electrode.

For instance, international application WO 2009/089872 A1 describes a charge-transfer capacitive sensor comprising a measuring capacitor, an accumulation capacitor, a switching device, a comparator and a microcontroller. The measuring capacitor serves during a succession of periodic time intervals for storing a quantity of electrical charges as a function of a parameter to be measured. The accumulation capacitor is provided for discharging, between two intervals, the charges contained in the measuring capacitor. The capacitance of the accumulation capacitor is much greater than the capacitance of the measuring capacitor, for instance by a factor of 1000. The switching device is configured for, during the intervals, electrically connecting the measuring capacitor either to a voltage source or to the accumulation capacitor. The comparator is provided for comparing an electrical signal at terminals of the accumulation capacitor with a reference signal and supplying an end-of-measurement signal. The microcontroller is configured for determining a value of the parameter to be measured when it receives the end-of measurement signal. For reducing electric power consumption, a counter and a periodic signal generator, both separate from the microcontroller, are provided for carrying out a portion of the measurement procedure.

SUMMARY

It is an object of the invention to provide an improved capacitive measurement circuit for a capacitive measurement system with a large offset capacitance range and a high sensitivity over the complete offset range.

In one aspect of the present invention, the object is achieved by a measurement circuit for a capacitive measurement system. The capacitive measurement system shall include at least one electrically conductive electrode that is provided for forming a capacitor in conjunction with a reference electrode. In the following, this capacitor may also be referred to as the "unknown capacitor".

The measurement circuit comprises
a direct current voltage source for providing a charging voltage,
at least a first switching member,
a charge transfer circuit including
  at least one active semiconductor device and
  a direct current bias voltage source that is configured for controlling an operating point of the at least one active semiconductor device,
  the charge transfer circuit being configured for receiving an electric input current at an input port and, by making use of current-voltage characteristics of the at least one active semiconductor device, for giving out an electric output current at an output port that is equal to the electric input current within a predetermined range of voltages across the input port and the output port of the charge transfer circuit,
an integration capacitor that is electrically connected to the output port, and
a current sink that is electrically connected in parallel to the integration capacitor and that is provided for partially discharging the integration capacitor in at least one mode of operation, Further, the direct current voltage source is electrically connectable to the at least one electrically conductive electrode in a first switching state of the first switching member. The at least one electrically conductive electrode is electrically connected to the input port of the charge transfer circuit in a second switching state of the first switching member. Then, a voltage provided across the integration capacitor is representative of the capacitance of the capacitor formed by the at least one electrically conductive electrode in conjunction with the reference electrode.

The phrase "being configured to", as used in this application, shall in particular be understood as being specifically programmed, laid out, furnished or arranged, The phrase "electric output current is equal to the electric input current", as used in this application, shall be understood such that a relative difference between the electric output current and the electric input current shall be less than 5%, more preferably less than 2%, and, most preferably, less than 1% of the electric input current, In this way, an amount of electric charge can be transferred from the unknown capacitor to the integration capacitor that is substantially independent of the charging status of the integration capacitor. If the charge transfer circuit was not present in the proposed measurement circuit, such that the at least one electrically conductive electrode was directly electrically connected to the integration capacitor, the amount of transferred electric charge would decrease with each additional charge transfer cycle. Herein, a charge transfer cycle shall be defined as charging the unknown capacitor and subsequently electrically connecting the at least one electrically conductive electrode to the integration capacitor for transferring electric charge to the latter. A difference in voltage between a voltage of the unknown capacitor and a voltage of the integration capacitor would decrease with each additional charge transfer cycle, as the voltage of the integration capacitor increases over a measurement sequence including a plurality of charge transfer cycles. In fact, a sensitivity of the measurement circuit would decrease asymptotically to zero after a global maximum if the number of transfer cycles is increased. This means that the sensitivity could not be increased by increasing the number of charge transfer cycles. The measurement circuit in accordance with the invention eliminates this problem, enabling to increase the sensitivity of the measurement substantially proportionally to the number of charge transfer cycles.

Preferably, the first switching member is a switch member of the "break-before-make" (BBM) type.

It is particularly noted that for the proposed measurement circuit, in contrast to measurement circuits of the prior art, there is no requirement concerning a capacitance value of the integration capacitor relative to the unknown capacitor.

The reference electrode may in particular be formed by a vehicle chassis ground or a ground the vehicle is driving on.

In preferred embodiments of the measurement circuit, the at least one active semiconductor device is a transistor that is arranged in a common-base or common-gate configuration. By that, a charge transfer circuit can be provided that has a simple layout and that can readily be implemented in a cost-effective way, using a small number of components.

The transistor may be a bipolar transistor (NPN or PNP-type) or any transistor of one of the existing various field-effect transistor (FET) types, such as MESFET (metal-semiconductor field-effect transistor), MOSFET (metal-oxide-semiconductor field-effect transistor), JFET (junction field-effect transistor), etc. that appears suitable to those skilled in the art.

Most preferred, the input port of the charge transfer circuit is electrically connected to the emitter (or source, respectively) of the transistor, and the output port of the charge transfer circuit is electrically connected to the collector (or drain, respectively) of the transistor. The direct current bias voltage source of the charge transfer circuit is used to determine a suitable emitter (or source) current.

In case of a bipolar transistor, the current amplification (collector current $i_S$/emitter current $i_E$ is given by $\beta/(\beta+1)$, wherein $\beta$ denotes the ratio of collector current and base current $i_C/i_B$. For many bipolar transistors, $\beta$ is in the range of several 100, which makes the current amplification substantially equal to 1. For FETs, there is usually no base current at all, so that the source current equals the drain current.

Preferably, the transistor is operated as a common-base or common-gate amplifier. Suitable operating regimes are located along a linear output characteristic of constant emitter (source) current, as is schematically shown in FIG. 3.

As will be appreciated by those skilled in the art, the collector current is substantially equal to the emitter current, and in the common-gate amplifying regime, the collector current is substantially independent of a voltage between collector and base, and therefore also between emitter and collector of the transistor. This can enable a transfer of constant amounts of electric charge from the unknown capacitor to the integration capacitor.

Preferably, the measurement circuit further includes a second switching member that is connected in parallel to the integration capacitor and that is configured to provide an open circuit in a first switching state and to provide an electrical path for discharging the integration capacitor in a second switching state. By that, a larger range for compensating an offset capacitance of the unknown capacitor can be accomplished.

It is noted herewith that the terms "first" and "second" are used in this application for distinction purposes only, and are not meant to indicate or anticipate a sequence or a priority in any way.

In some preferred embodiments, the first switching member, the second switching member and the current sink are remotely controllable, which can beneficially allow for using the measurement circuit in an automated measurement procedure.

In some embodiments, the current sink is a remotely switchable constant current sink. This can allow for readily defining an amount of electric charge to be discharged from the integration capacitor by selecting a duration of the discharging by remotely switching for a predetermined constant electric current of the current sink. By that, a high flexibility for selecting discharging parameters can be accomplished.

In other preferred embodiments, the current sink is a remotely controllable variable current sink. This can allow for readily defining an amount of electric charge to be discharged from the integration capacitor by remotely controlling a current level of the discharging for a predetermined duration of the discharging. By that, a high flexibility for selecting discharging parameters can be accomplished.

In another aspect of the invention, a capacitive measurement system is provided that includes
  an embodiment of the measurement circuit as disclosed herein,
  at least one electrically conductive electrode that is provided for forming a capacitor with a reference electrode, and
  a microcontroller that is configured for remotely controlling the first switching member, the second switching member and the current sink.

The benefits presented before with regard to the measurement circuit apply to the capacitive measurement system to their full extent.

Preferably, the microcontroller comprises includes a processor unit, a digital data memory unit, a microcontroller system clock and a plurality of pulse width modulation units for remotely controlling the first switching member, the second switching member and the current sink, respectively. Such equipped microcontrollers are commercially available nowadays in many variations and at economic prices. In this way, an automated measurement procedure employing the measurement circuit disclosed herein can be enabled.

In preferred embodiments of the capacitive measurement system, the microcontroller includes at least one analog-to-digital converter (ADC) having an input port that is electrically connected to the integration capacitor for determining the voltage across the integration capacitor. This can allow for fast and undisturbed digital signal processing.

In another aspect of the present invention, a method of operating the capacitive measurement system disclosed herein is provided. The method comprises steps of electrically connecting the at least one electrically conductive electrode to the direct current voltage source,
charging the capacitor formed by the at least one electrically conductive electrode in in conjunction with the reference electrode for a predetermined time period,
electrically connecting the at least one electrically conductive electrode to the input port of the charge transfer circuit,
at least partially discharging the capacitor formed by the at least one electrically conductive electrode in conjunction with the reference electrode for a predetermined period of time into the integration capacitor via the charge transfer circuit,
partially discharging the integration capacitor by a predetermined amount of electric charge by remotely controlling the current sink,
repeating the preceding steps a predetermined number of times, and
after completion of repeating the steps for the predetermined number of times, determining the voltage of the integration capacitor by the analog-to-digital converter.

If so required, the method may include a preceding step of discharging the integration capacitor to a predefined voltage level via the second switching member.

It is noted that it is not mandatory to conduct the step of partially discharging the integration capacitor by remotely controlling the current sink in any timely correlation, for instance in a synchronous manner, with the step of charging the unknown capacitor for a predetermined time period, which in some embodiments of the method may nevertheless be the case.

In preferred embodiments, the method further includes steps of
if the determined voltage of the integration capacitor is lower than or equal to a predetermined lower voltage threshold, decreasing the predetermined amount of electric charge for partially discharging the integration capacitor,
if the determined voltage of the integration capacitor is greater than or equal to an upper predetermined voltage threshold, increasing the predetermined amount of electric charge for partially discharging the integration capacitor, and
carrying out the steps of the formerly described embodiment.

The transferred amount of electric charge is the product of a constant electric discharging current and the duration of the discharging period, so decreasing (increasing) the predetermined amount of electric charge for discharging the integration capacitor can be conducted either by lowering (increasing) the electric current level or by reducing (increasing) the discharging period time or by a combination of both.

In preferred embodiments, the steps of the method are automatically and periodically carried out. Preferably, the steps are carried out by the microcontroller.

In yet another aspect of the invention, a software module for controlling an automatic execution of steps of an embodiment of the method disclosed herein is provided.

The method steps to be conducted are converted into a program code of the software module, wherein the program code is implementable in a digital data memory unit of the capacitive measurement system or a separate control unit and is executable by a processor unit of the capacitive measurement system or a separate control unit. Preferably, the digital data memory unit and/or processor unit may be a digital data memory unit and/or a processor unit of the microcontroller of the capacitive measurement system. The processor unit may, alternatively or supplementary, be another processor unit that is especially assigned to execute at least some of the method steps.

The software module can enable a robust and reliable execution of the method and can allow for a fast modification of method steps.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
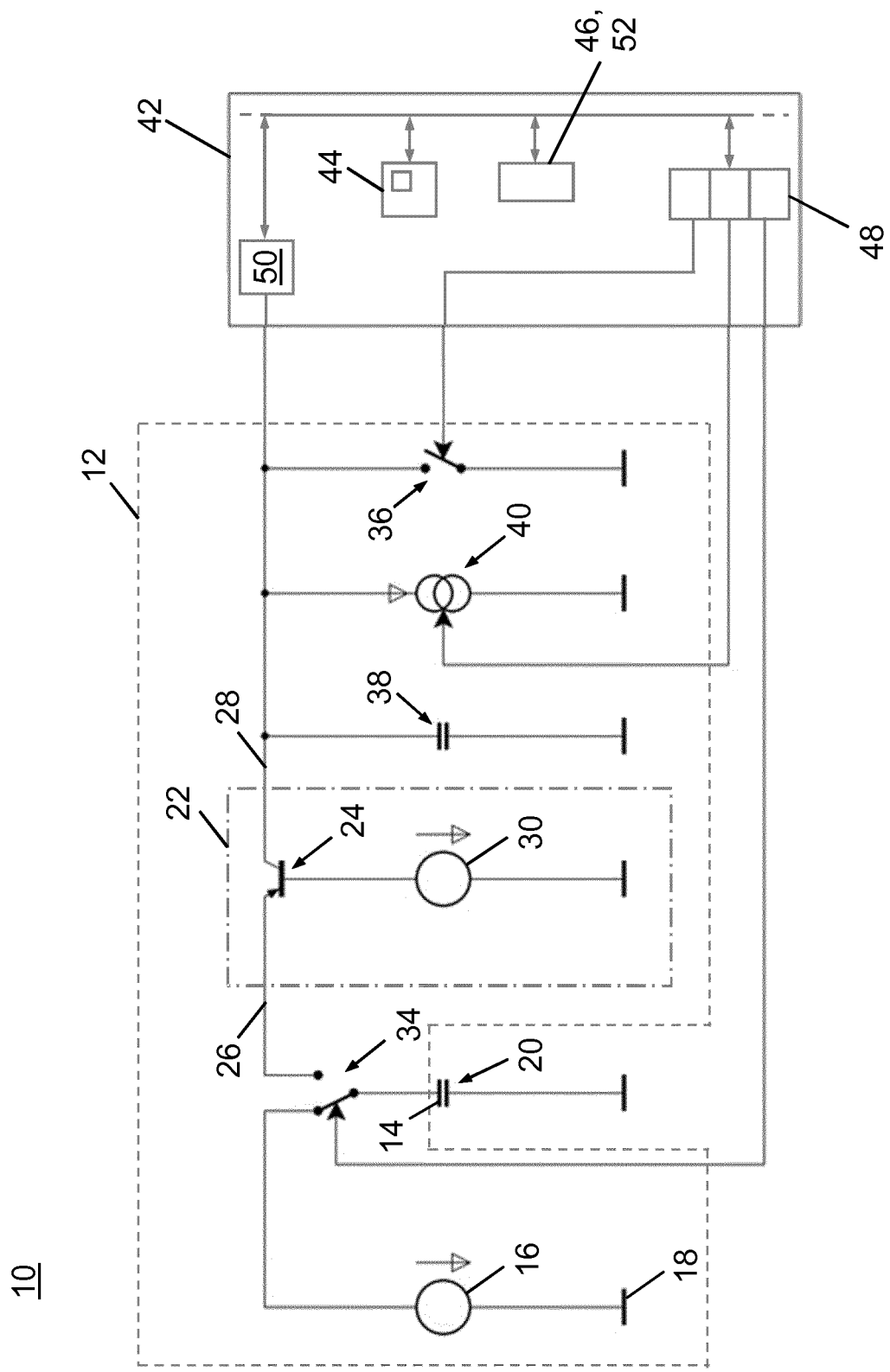
FIG. 1 shows a layout of an embodiment of a capacitive measurement system which comprises a measurement circuit in accordance with the invention.

FIG. 1 schematically shows a layout of an embodiment of a capacitive measurement system 10. The capacitive measurement system 10 comprises a measurement circuit 12 in accordance with the invention, and an electrically conductive electrode 14 that is provided for forming a capacitor 20 in conjunction with a reference electrode, which capacitor 20 may be referred to as the "unknown capacitor" 20 hereinafter. The capacitance of the unknown capacitor 20 is influenced by presence of an object or a living being in its vicinity. The capacitance may have an offset capacitance portion due to varying ambient and/or surrounding conditions of the unknown capacitor 20. In this specific embodiment, the reference electrode is formed by a vehicle chassis.

The measurement circuit 12 includes a direct current (DC) voltage source 16 for providing a charging voltage with reference to a ground potential 18 which is given by the electric potential of the reference electrode, a first switching member 34, a second switching member 36 and a charge transfer circuit 22. The DC voltage source 16 is electrically connected to the first switching member 34 such that it is connected to the electrically conductive electrode 14 in a first switching state of the first switching member 34.

Figure 3:
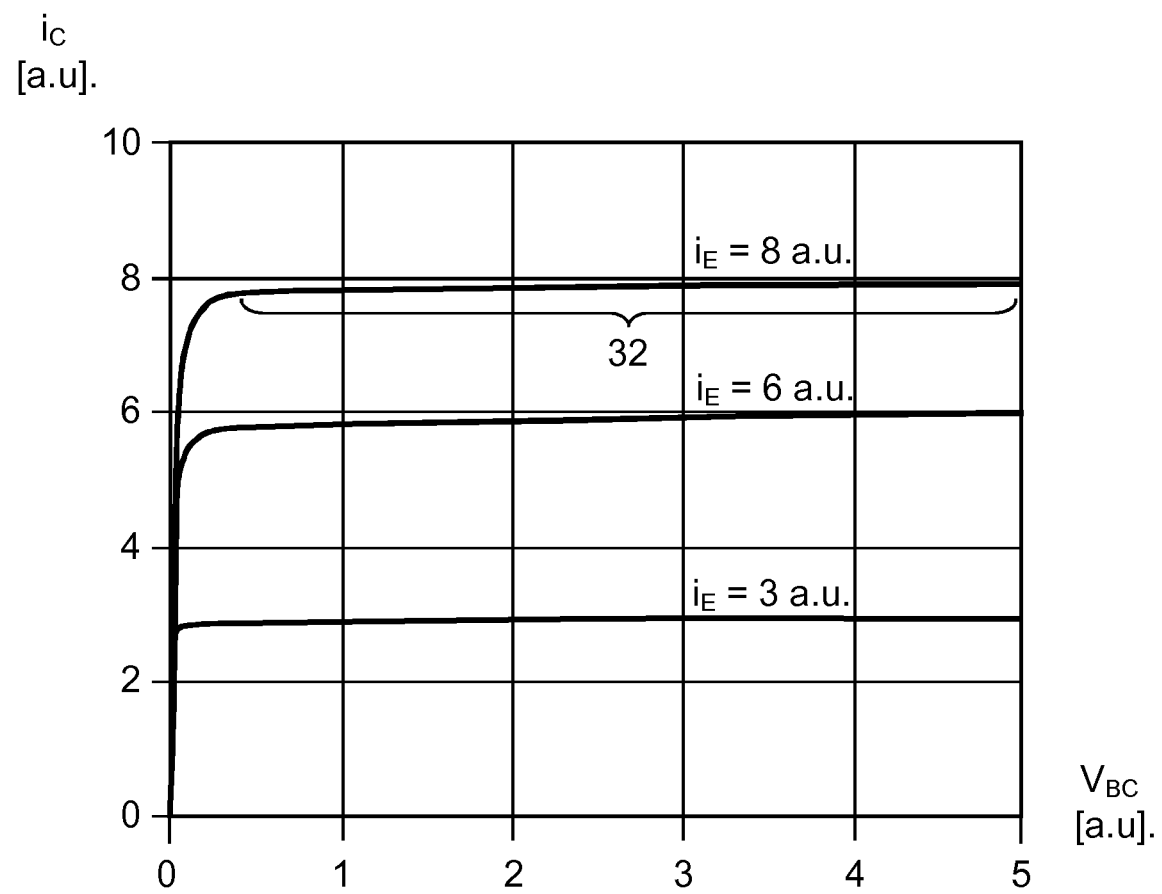
FIG. 3 is a schematic diagram of the output characteristics of the transistor of the measurement circuit pursuant to FIG. 1 in common-base configuration.

The charge transfer circuit 22 comprises an active semiconductor device formed by a bipolar transistor 24 of the PNP-type. The transistor 24 is arranged in a common-base configuration. A DC bias voltage source 30 of the charge transfer circuit 22 is electrically connected to the base of the transistor 24 so as to control an operating point of the transistor 24 to lie within the amplifying regime 32 of a predefined emitter current $i_E$ (FIG. 3). The transistor emitter forms an input port 26 of the charge transfer circuit 22, and the transistor collector forms an output port 28 of the charge transfer circuit 22. In a second switching state of the first switching member 34, the unknown capacitor 20 is electrically connected to the transistor emitter; i.e. the input port 26 of the charge transfer circuit 22. The first switching member 34 is a break-before-make (BBM) type switch, so that the DC voltage source 16 is not electrically connected to the input port 26 at any time of operation.

Furthermore, the measurement circuit 12 comprises an integration capacitor 38 that is electrically connected to the output port 28 of the charge transfer circuit 22 and to ground potential 18, and a current sink 40 that is electrically connected in parallel to the integration capacitor 38.

In this specific embodiment, the current sink 40 is designed as a switchable constant current sink that can be remotely activated by applying an appropriate voltage signal to a control port. In other embodiments, it is also contemplated to employ a current sink that is designed as a remotely controllable variable current sink. In this case, for instance a voltage-controlled current sink may be connected to a digital-to-analog (DAC) output that may form part of a microcontroller.

The second switching member 36 is also connected in parallel to the integration capacitor 38. The second switching member 36 is configured to provide an open circuit in a first switching state and to provide an electrical path to ground potential 18 for discharging the integration capacitor 38 in a second switching state, as will be described later on.

The switching states of the first switching member 34 and the second switching member 36 can be remotely controlled by applying an appropriate voltage signal to their respective control port.

The capacitive measurement system 10 further includes a microcontroller 42. The microcontroller 42 comprises a processor unit 44, a digital data memory unit 46 to which the processor unit 44 has data access, and a microcontroller system clock (not labeled) that forms part of the processor unit 44. The microcontroller 42 is configured for remotely controlling the first switching member 34, the second switching member 36 and the current sink 40. To this end, the microcontroller 42 is equipped with a plurality of pulse width modulation (PWM) units 48 that are able to provide mutually independent PWM signals. The control ports of the first switching member 34, the second switching member 36 and the current sink 40 are each connected to one of the plurality of PWM units 48.

Moreover, the microcontroller 42 includes an analog-to-digital converter (ADC) 50 having an input port that is electrically connected to the integration capacitor 38 for determining the voltage across the integration capacitor 38.

Figure 2:
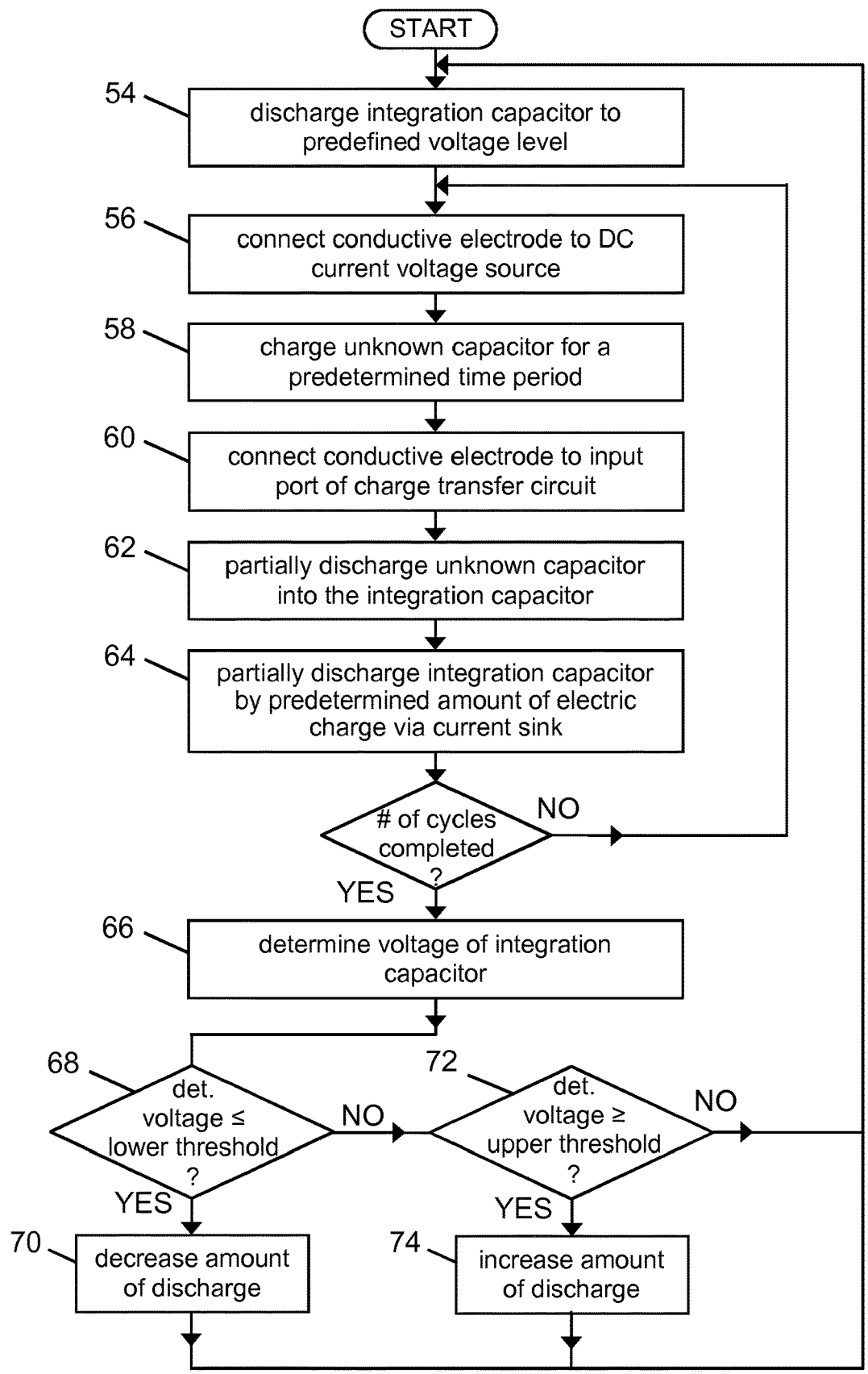
FIG. 2 is a flowchart of an embodiment of a method in accordance with the invention.

In the following, an embodiment of a method of operating the capacitive measurement system 10 pursuant to FIG. 1 will be described. A flowchart of the method is provided in FIG. 2. In preparation of using the capacitive measurement system 10, it shall be understood that all involved units and devices are in an operational state and configured as illustrated in FIG. 1.

In order to be able to carry out the method automatically and periodically, the microcontroller 42 comprises a software module 52 (FIG. 1). The method steps to be conducted are converted into a program code of the software module 52. The program code is implemented in the digital data memory unit 46 of the microcontroller 42 and is executable by the processor unit 44 of the microcontroller 42.

Referring again to FIG. 2, in a first preparatory step 54 of the method, the second switching member 36 is controlled to the second switching state by the microcontroller 42 for discharging the integration capacitor 38 to a predefined voltage level. After the discharging is completed, the second switching member 36 is set back to the first switching state (open circuit) by the microcontroller 42.

In a next step 56, the electrically conductive electrode 14 is electrically connected to the DC voltage source 16 by controlling the first switching member 34 to the first switching state. In the following step 58, the unknown capacitor 20 is charged for a predetermined time period. Then, in the next step 60, the electrically conductive electrode 14 is electrically connected to the input port 26 of the charge transfer circuit 22; i.e. the emitter of the transistor 24. Following this, the unknown capacitor 20 is partially discharged for a predetermined period of time into the integration capacitor 38 via the charge transfer circuit 22 in another step 62.

The charge transfer circuit 22 receives an electric input current from the unknown capacitor 20 at the input port 26 and, by making use of the operating point lying within the amplifying regime 32 of the transistor 24 in common-mode configuration, gives out an electric output current at the output port 28 that is, disregarding a minor base current, equal to the electric input current within a predetermined range of voltages across the input port 26 and the output port 28 of the charge transfer circuit 22 (FIG. 3).

In another step 64, the microcontroller 42 remotely controls the current sink 40 to partially discharge the integration capacitor 38 by a predetermined amount of electric charge.

The preceding steps 56-64, with the exception of the preparatory step 54 of discharging the integration capacitor 38 to a predefined voltage level, are automatically and periodically repeated for a predetermined number of times. If the predetermined number of cycles is completed, the voltage across the integration capacitor 38 is determined by the ADC 50 of the microcontroller 42 in the next step 66.

In the following step 68, it is checked if the determined voltage of the integration capacitor 38 is lower than or equal to a predetermined lower voltage threshold. If so, the predetermined amount of electric charge for partially discharging the integration capacitor 38 is decreased by the microcontroller 42 in the next step 70, and the execution of the method steps is started all over again, beginning with the step 54 of discharging the integration capacitor 38 to a predefined voltage level.

If the determined voltage of the integration capacitor 38 is larger than the predetermined lower voltage threshold, it is checked if the determined voltage of the integration capacitor 38 is greater than or equal to an upper predetermined voltage threshold in a next step 72. If so, the predetermined amount of electric charge for partially discharging the integration capacitor 38 is increased by the microcontroller 42, and the execution of the method steps is started all over again, beginning with the step 54 of discharging the integration capacitor 38 to a predefined voltage level.

If the determined voltage of the integration capacitor 38 is larger than the predetermined lower voltage threshold and less than the upper predetermined voltage threshold, this means that the determined voltage of the integration capacitor 38 lies within an input measurement range of the ADC 50. In this case, the determined voltage is considered representative of the capacitance of the unknown capacitor 20. A new measurement cycle is then automatically initiated by the microcontroller 42.

In the specific embodiment disclosed above, the transistor 24 is described to be of the PNP-type. Those skilled in the art will readily appreciate that the employed bipolar transistor may also be of the NPN-type, and will be able to make the necessary modifications of the capacitive measurement system and particularly of the measurement circuit without any instructions, based on their common average knowledge.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A measurement circuit for a capacitive measurement system, the capacitive measurement system including at least one electrically conductive electrode that is provided for forming a capacitor in conjunction with a reference electrode, the measurement circuit comprising:
    a direct current voltage source for providing a charging voltage,
    at least a first switching member,
    a charge transfer circuit including:
        at least one active semiconductor device, wherein the at least one active semiconductor device is a transistor that is arranged in a common-base or common-gate configuration, and
        a direct current bias voltage source that is configured for controlling an operating point of the at least one active semiconductor device,
    the charge transfer circuit being configured for receiving an electric input current at an input port and, by making use of current-voltage characteristics of the at least one active semiconductor device, for giving out an electric output current at an output port that is equal to the electric input current within a predetermined range of voltages across the input port and the output port of the charge transfer circuit,
    an integration capacitor that is electrically connected to the output port, and
    a current sink that is electrically connected in parallel to the integration capacitor and that is provided for partially discharging the integration capacitor in at least one mode of operation,
    wherein
        the direct current voltage source is electrically connectable to the at least one electrically conductive electrode in a first switching state of the first switching member,
        the at least one electrically conductive electrode is electrically connectable to the input port in a second switching state of the first switching member, and
        a voltage provided across the integration capacitor is representative of the capacitance of the capacitor formed by the at least one electrically conductive electrode in conjunction with the reference electrode.

2. The measurement circuit as claimed in claim 1, further comprising a second switching member that is connected in parallel to the integration capacitor and that is configured to provide an open circuit in a first switching state and to provide an electrical path for discharging the integration capacitor in a second switching state.

3. The measurement circuit as claimed in claim 2, wherein the first switching member, the second switching member and the current sink are remotely controllable.

4. The measurement circuit as claimed in claim 1, wherein the current sink is either a switchable constant current sink or a variable current sink.

5. A capacitive measurement system including:
    a measurement circuit as claimed in claim 1,
    at least one electrically conductive electrode that is provided for forming a capacitor with a reference electrode, and
    a microcontroller that is configured for remotely controlling the first switching member, the second switching member and the current sink.

6. The capacitive measurement system as claimed in claim 5, wherein the microcontroller includes:
    a processor unit,
    a digital data memory unit,
    a microcontroller system clock, and
    a plurality of pulse width modulation units.

7. The capacitive measurement system as claimed in claim 5, wherein the microcontroller includes at least one analog-to-digital converter having an input port that is electrically connected to the integration capacitor for determining the voltage across the integration capacitor.

8. A method of operating a capacitive measurement system that includes:
    at least one electrically conductive electrode that is provided for forming a capacitor with a reference electrode, and
    a measurement circuit comprising:
        a direct current voltage source for providing a charging voltage,
        at least a first switching member,
        a charge transfer circuit including:
            at least one active semiconductor device, and
            a direct current bias voltage source that is configured for controlling an operating point of the at least one active semiconductor device,
        the charge transfer circuit being configured for receiving an electric input current at an input port and, by making use of current-voltage characteristics of the at least one active semiconductor device, for giving out an electric output current at an output port that is equal to the electric input current within a predetermined range of voltages across the input port and the output port of the charge transfer circuit,
        an integration capacitor that is electrically connected to the output port, and
        a current sink that is electrically connected in parallel to the integration capacitor and that is provided for partially discharging the integration capacitor in at least one mode of operation, wherein
- the direct current voltage source is electrically connectable to the at least one electrically conductive electrode in a first switching state of the first switching member,
- the at least one electrically conductive electrode is electrically connectable to the input port in a second switching state of the first switching member, and
- a voltage provided across the integration capacitor is representative of the capacitance of the capacitor formed by the at least one electrically conductive electrode in conjunction with the reference electrode wherein the capacitive measurement system further comprises a microcontroller that is configured for remotely controlling the first switching member, the second switching member and the current sink;

the method comprising steps of:
- electrically connecting (56) the at least one electrically conductive electrode to the direct current voltage source,
- charging (58) the capacitor formed by the at least one electrically conductive electrode in conjunction with the reference electrode for a predetermined time period,
- electrically connecting (60) the at least one electrically conductive electrode to the input port of the charge transfer circuit,
- partially discharging (62) the capacitor formed by the at least one electrically conductive electrode in conjunction with the reference electrode for a predetermined period of time into the integration capacitor via the charge transfer circuit,
- partially discharging (64) the integration capacitor by a predetermined amount of electric charge by remotely controlling the current sink,
- repeating the preceding steps (56-64) a predetermined number of times, and
- after completion of repeating steps (56-64) for the predetermined number of times, determining (66) the voltage of the integration capacitor by the analog-to-digital converter.

9. The method as claimed in claim 8, further comprising steps of
- when the determined voltage of the integration capacitor is lower than or equal to a predetermined lower voltage threshold, decreasing (70) the predetermined amount of electric charge for partially discharging the integration capacitor,
- when the determined voltage of the integration capacitor is greater than or equal to an upper predetermined voltage threshold, increasing (74) the predetermined amount of electric charge for partially discharging the integration capacitor, and
- carrying out the steps (56-66).

10. The method as claimed in claim 8, wherein the steps (56-66) are automatically and periodically carried out.

11. A digital data memory unit storing a software module for carrying out the method as claimed in claim 10, wherein the method steps (56-66) to be conducted are converted into a program code of the software module, wherein the program code is executable by a processor unit of the capacitive measurement system or a separate control unit.

* * * * *